(12) United States Patent
Abe et al.

(10) Patent No.: US 6,308,056 B1
(45) Date of Patent: Oct. 23, 2001

(54) DOUBLE SUPER TUNER

(75) Inventors: Shuji Abe, Kumagaya; Yuji Ono, Fukaya; Kazuyoshi Yoshida, Saitama-ken; Takeshi Tokunaga, Fukaya, all of (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/306,380

(22) Filed: May 6, 1999

Related U.S. Application Data

(62) Division of application No. 08/622,147, filed on Mar. 27, 1996, now Pat. No. 5,918,168.

(30) Foreign Application Priority Data

Mar. 27, 1995 (JP) ................................................... 7-067638

(51) Int. Cl.[7] ............................................................ H04B 1/06
(52) U.S. Cl. ........................... 455/301; 455/333; 455/349
(58) Field of Search ................................... 455/315, 301, 455/307, 339, 338, 313, 314, 316, 323, 333, 292, 293, 300, 349, 347; 333/167, 172, 177, 182, 184; 361/736, 748, 750, 751, 753, 761

(56) References Cited

U.S. PATENT DOCUMENTS

| | | | |
|---|---|---|---|
| 4,375,626 | 3/1983 | Hudak | 334/79 |
| 4,553,264 | 11/1985 | Hasegawa et al. | 455/315 |
| 4,599,587 | 7/1986 | Hartmann et al. | 333/176 |
| 5,020,147 | 5/1991 | Okanobu | 455/302 |
| 5,212,828 | 5/1993 | Hatashita et al. | 455/339 |
| 5,313,662 | 5/1994 | Ooi et al. | 455/339 |
| 5,379,185 | * 1/1995 | Griffin et al. | 361/709 |
| 5,517,685 | 5/1996 | Aoyama et al. | 455/316 |
| 5,519,890 | 5/1996 | Pinckley | 455/307 |
| 5,528,769 | 6/1996 | Berenz et al. | 455/333 |

FOREIGN PATENT DOCUMENTS 6-260949   9/1994   (JP) ..................................... 455/300

OTHER PUBLICATIONS

Michels et al., A High–Performance, Miniaturiazed–X–Band Active Mixer for DBS Receiver Application With On–Chip IF Noise Filter, 1990, pp. 1249–1251.

* cited by examiner

*Primary Examiner*—Nguyen T. Vo
(74) *Attorney, Agent, or Firm*—Pillsbury Winthrop LLP

(57) ABSTRACT

A double super tuner for receiving television signals from conventional broadcast, CATV, satellite broadcast, and HDTV. A first frequency converter converts an input high-frequency signal in a first intermediate frequency band signal based on a first local oscillator signal. The output of the first frequency converter is band-pass filtered by a dielectric filter. A second frequency converter converts the output of the dielectric filter into a second intermediate frequency band signal based on a second local oscillator signal.

2 Claims, 9 Drawing Sheets

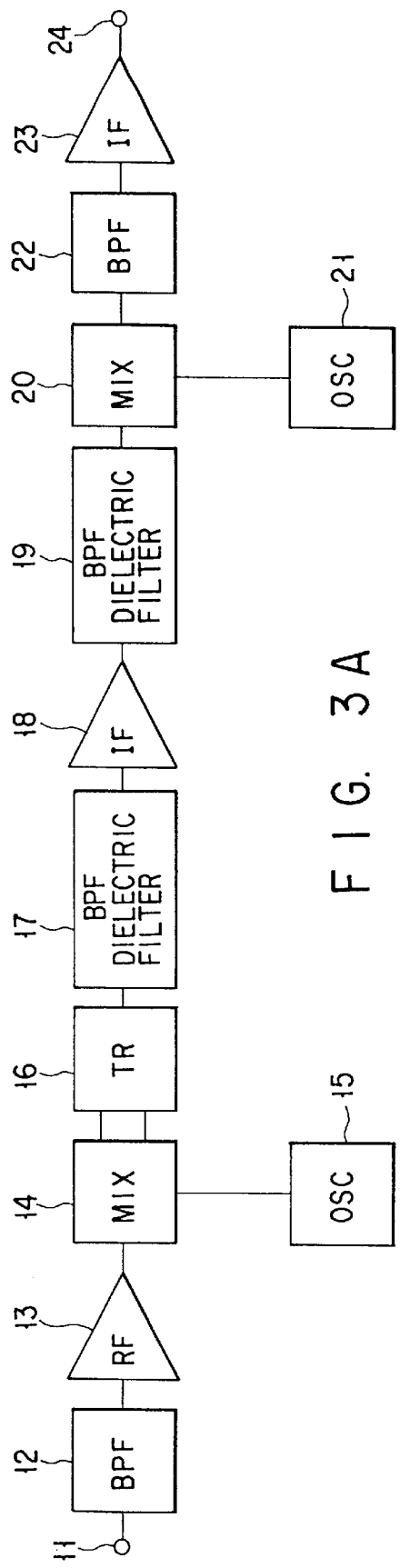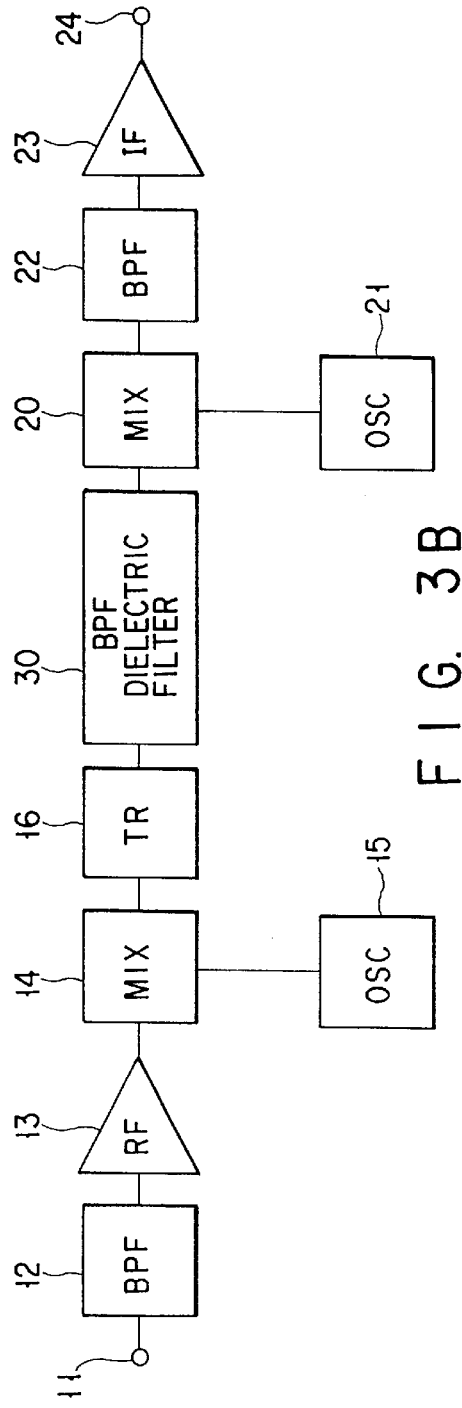
F I G. 3A
F I G. 3B

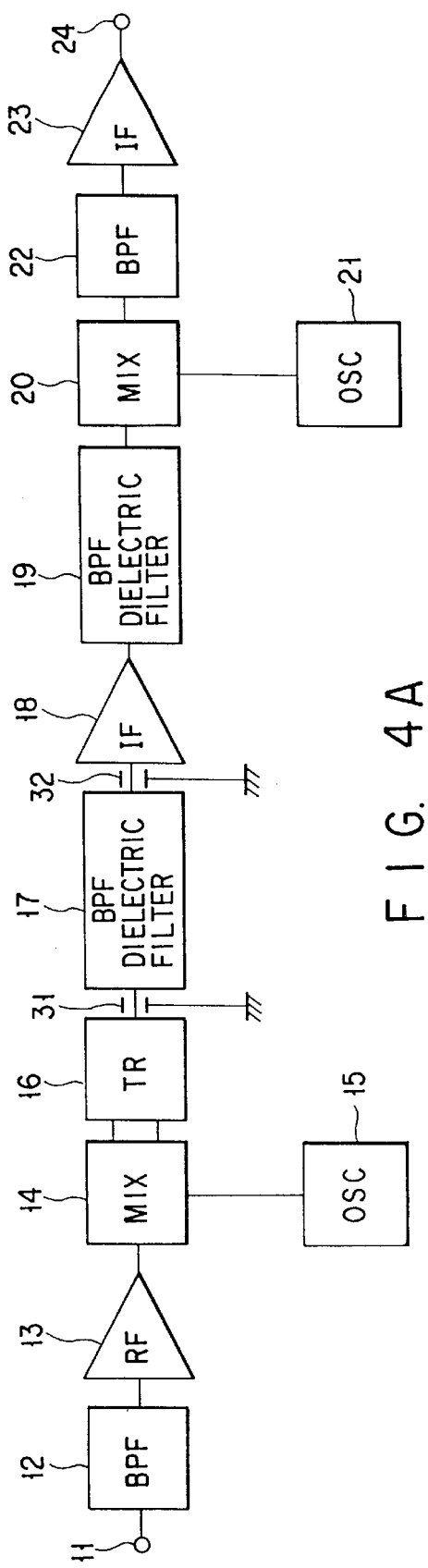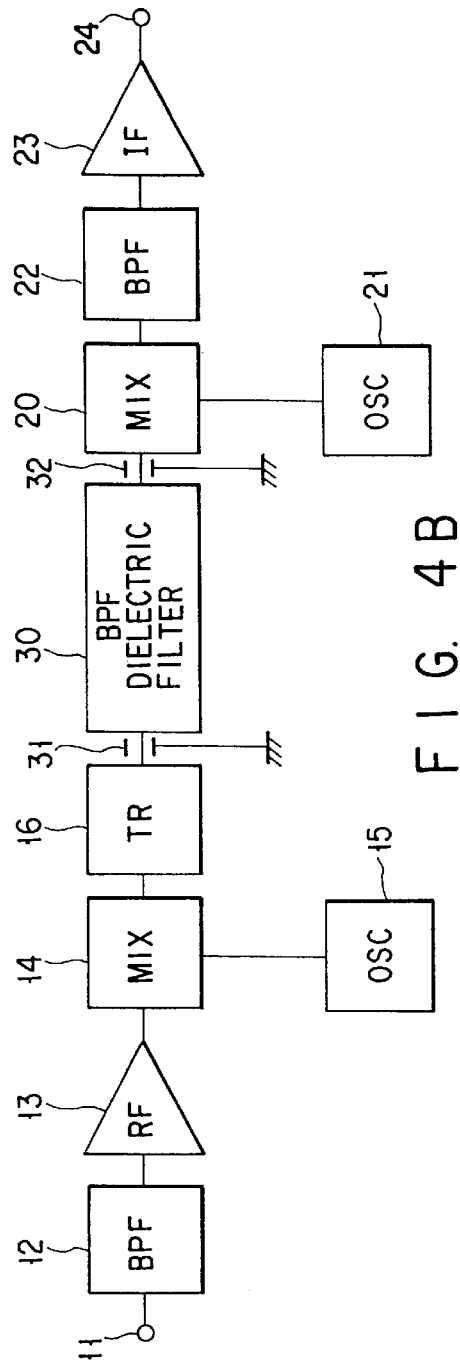
FIG. 4A
FIG. 4B

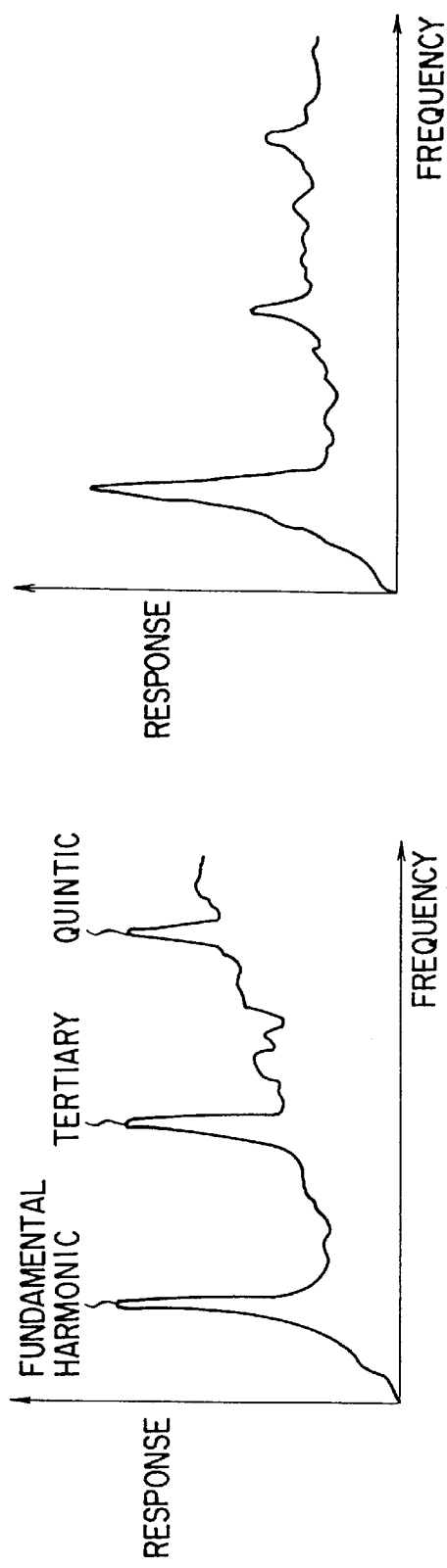
FIG. 5A
FIG. 5B
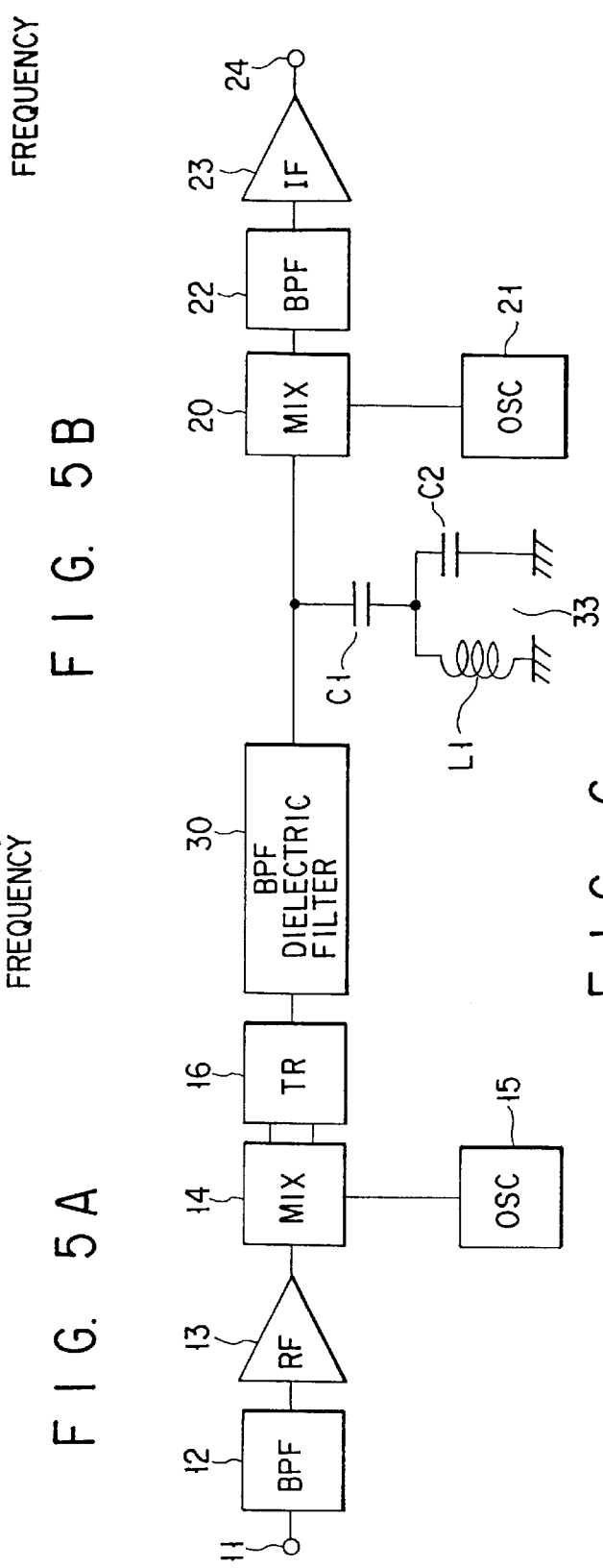
FIG. 6

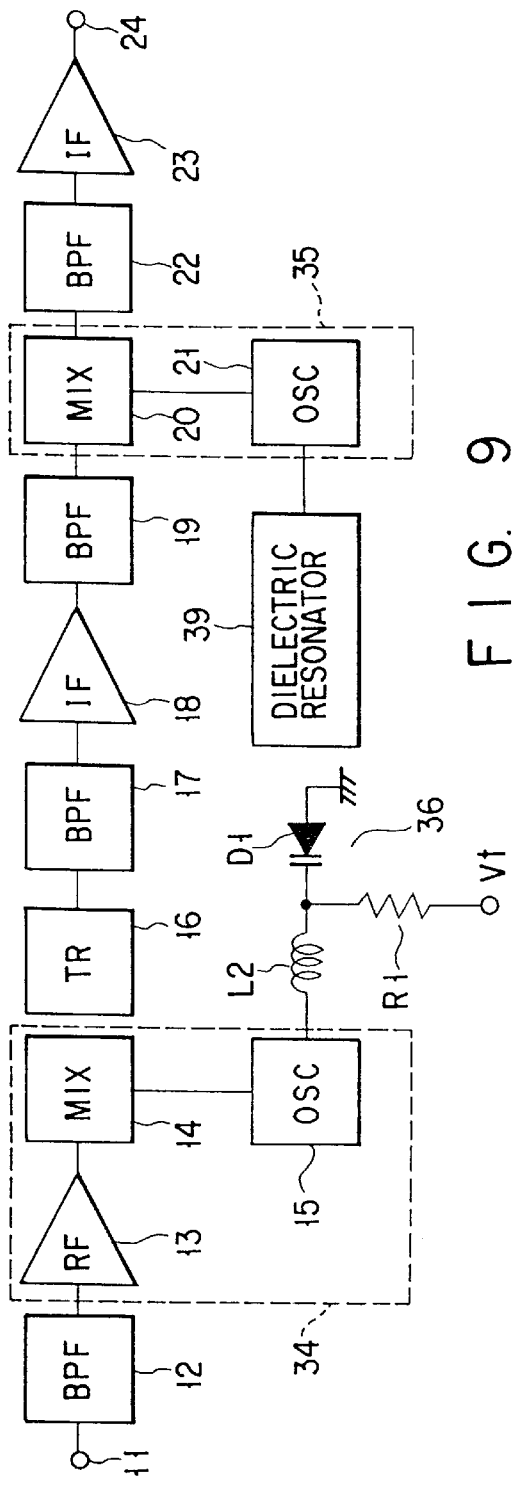
F I G. 9
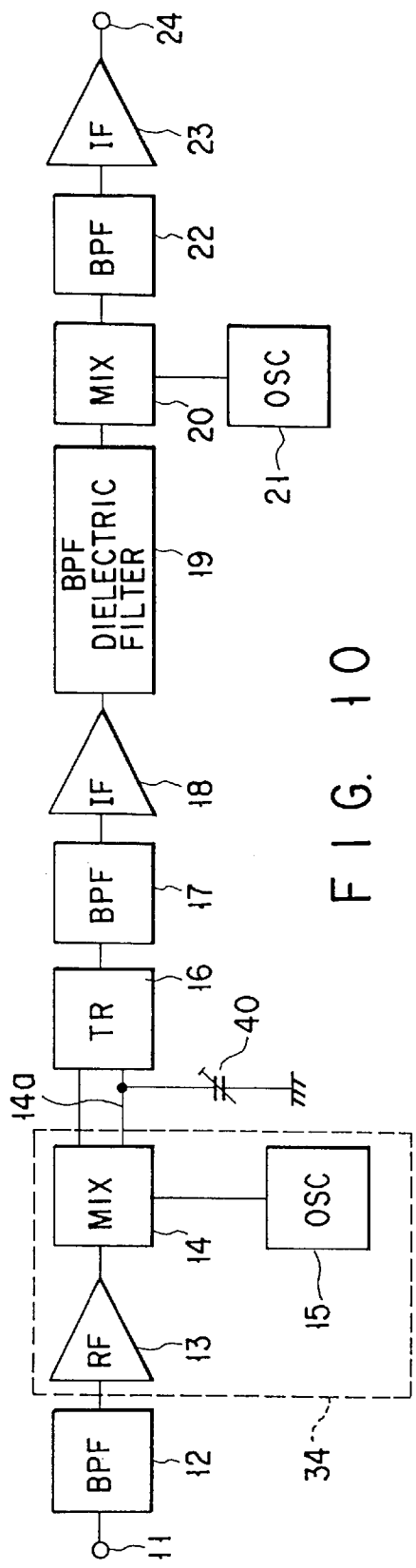
F I G. 10

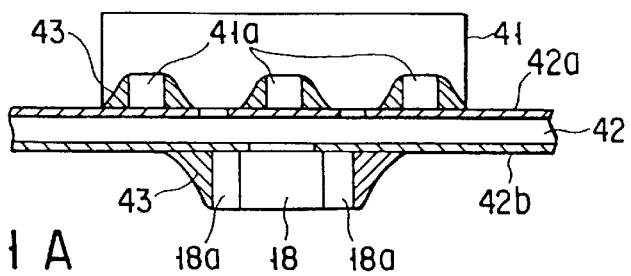
FIG. 11A
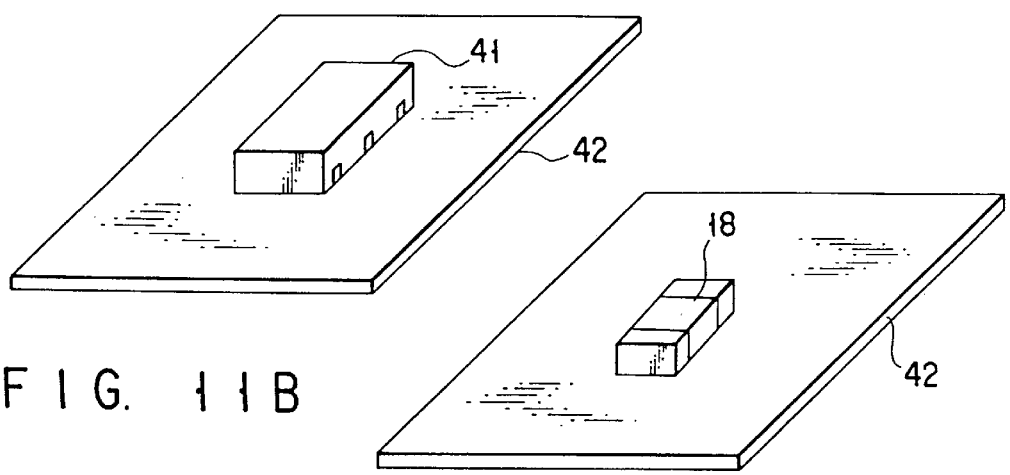
FIG. 11B
FIG. 11C
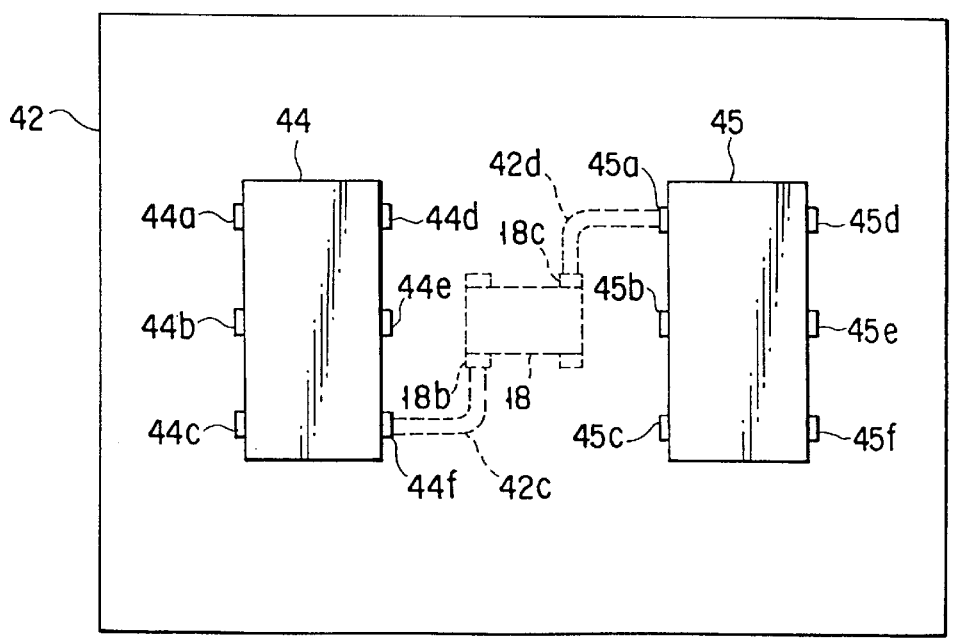
FIG. 12

DOUBLE SUPER TUNER

This is a division of application Ser. No. 08/622,147, filed Mar. 27, 1996, U.S. Pat. No. 5,918,168.

BACKGROUND OF THE INVENTION

1. Field of the Invention

This invention relates to the improvement of a double super tuner suitable for reception of CATV (Cable Television) broadcast, satellite broadcast, and HDTV (High Definition Television) broadcast in the UHF (Ultra High Frequency) band or the like, for example.

2. Description of the Related Art

As is well known in the art, a double super tuner is constructed as shown in FIG. 1. In FIG. 1, a reference numeral 11 denotes an input terminal which is supplied with an RF (Radio Frequency) signal obtained by receiving the broadcast. The RF signal supplied to the input terminal 11 is supplied to a wideband BPF (Band Pass Filter) 12 which permits passage of signals of entire reception frequency band, amplified by an RF amplifier circuit 13, and then supplied to a first frequency converter circuit 14.

The first frequency converter circuit 14 frequency-converts (up-converts) the input RF signal into a corresponding first intermediate frequency signal based on a local oscillation signal output from a first local oscillation circuit 15. As the first frequency converter circuit 14, a balanced-output type frequency converter circuit is generally used. Therefore, first intermediate frequency signals are output in a balanced state from the first frequency converter circuit 14.

The first intermediate frequency signals output in the balanced state from the first frequency converter circuit 14 are converted into an unbalanced signal by a balanced-unbalanced conversion transformer 16 and then supplied to an unbalanced-input type BPF 17 for first intermediate frequency for effecting the band-pass filtering process for the first intermediate frequency band. The first intermediate frequency signal output from the unbalanced-input type BPF 17 for first intermediate frequency serially passes through a first intermediate frequency amplifier circuit 18 and BPF 19 for first intermediate frequency which are designed for the first intermediate frequency band and is then supplied to a second frequency converter circuit 20.

The second frequency converter circuit 20 converts the input first intermediate frequency signal into a corresponding second intermediate frequency signal based on a local oscillation signal output from a second local oscillation circuit 21. The second intermediate frequency signal output from the second frequency converter circuit 20 serially passes through a second BPF 22 for second intermediate frequency and second intermediate frequency amplifier circuit 23 which are designed for the second intermediate frequency band and is then derived from an output terminal 24.

As shown in FIG. 2A, for example, the above double super tuner has an insertion component 26 such as an air-core coil and various types of on-surface mounting components 27 which are mounted on a printed circuit board 25. In this case, the printed circuit board 25 has circuit patterns 25a formed on both surfaces thereof. The insertion component 26 is inserted from the front surface side of the printed circuit board 25 to the rear surface side and connected to the circuit pattern 25a on the rear surface by solder 28 together with the on-surface mounting components 27.

For soldering the circuit pattern 25a and on-surface mounting components 27 formed on the front surface of the printed circuit board 25, a reflow soldering process is used. Further, as shown in FIG. 2B, the printed circuit board 25 having various types of insertion components 26 and on-surface mounting components 27 mounted thereon is set in a shield case 29 and circuit blocks thereof are separated by use of shield plates 29a so as to attain isolation between the circuit blocks.

It is, however, desirable to improved upon the conventional double super tuner, to simplify circuit construction and enhance performance. In an effort to do so, various studies and developments have been made.

SUMMARY OF THE INVENTION

This invention provides a double super tuner which is suitable for small size, simple in circuit construction, economical, and has a sophisticated performance.

Our double super tuner includes a first frequency converting means for frequency-converting an input high-frequency signal into a first intermediate frequency signal based on a first local oscillation signal. A filter band pass filters the first intermediate frequency signal output from the first frequency converting means to produce the first intermediate frequency band. A second frequency converting means coverts an output signal of the filter into a second intermediate frequency signal based on a second local oscillation signal. A dielectric filter is used to provide the above-described band pass characteristic.

With the above construction, since a dielectric filter is used as the filter for subjecting the first intermediate frequency signal to the band-pass filtering process for the first intermediate frequency band, an attenuation amount required for the band-pass filter for the first intermediate frequency band can be attained and a stable operation can be easily attained even with temperature variation and deterioration with time.

Further, a double super tuner according to this invention comprises first frequency converting means for frequency-converting an input high-frequency signal into a first intermediate frequency signal based on a first local oscillation signal; and second frequency converting means for converting the first intermediate frequency signal output from the first frequency converting means into a second intermediate frequency signal based on a second local oscillation signal. In this case, an active mixer circuit used for the second frequency converting means and a second local oscillation signal generating circuit are formed in an integrated circuit form and a surface acoustic wave resonator is used for the resonance circuit of the second local oscillation signal generating circuit.

With the above construction, since the active mixer circuit used for the second frequency converting means and the second local oscillation signal generating circuit are formed in an integrated circuit form and the surface acoustic wave resonator is used for the resonance circuit of the second local oscillation signal generating circuit, the frequency stability can be made sufficiently high with respect to variations in temperature and humidity.

Further, a double super tuner according to this invention comprises first frequency converting means for frequency-converting an input high-frequency signal into a first intermediate frequency signal based on a first local oscillation signal; and second frequency converting means for converting the first intermediate frequency signal output from the first frequency converting means into a second intermediate frequency signal based on a second local oscillation signal. In this case, an active mixer circuit used for the second frequency converting means and a second local oscillation signal generating circuit are formed in an integrated circuit form and a dielectric resonator is used for the resonance circuit of the second local oscillation signal generating circuit.

With the above construction, since the active mixer circuit used for the second frequency converting means and the second local oscillation signal generating circuit are formed in an integrated circuit form and the dielectric resonator is used for the resonance circuit of the second local oscillation signal generating circuit, the frequency stability can be made sufficiently high with respect to variations in temperature and humidity.

A double super tuner according to this invention comprises first frequency converting means of balanced output type for frequency-converting an input high-frequency signal into a first intermediate frequency signal based on a first local oscillation signal; and second frequency converting means for converting the first intermediate frequency signal output from the first frequency converting means into a second intermediate frequency signal based on a second local oscillation signal. In this case, a variable impedance element is connected to one of the balanced output terminals of the first frequency converting means.

With the above construction, since the variable impedance element is connected to one of the balanced output terminals of the first frequency converting means, the balance adjustment can be effected so that the unbalanced amounts of the integrated circuit, transformer and peripheral circuits can be corrected and the distortion characteristic and leakage characteristic can be improved.

Further, a double super tuner according to this invention comprises first frequency converting means for frequency-converting an input high-frequency signal into a first intermediate frequency signal based on a first local oscillation signal; intermediate frequency processing means for subjecting the first intermediate frequency signal output from the first frequency converting means to a process for the first intermediate frequency band; and second frequency converting means for converting an output signal of the intermediate frequency processing means into a second intermediate frequency signal based on a second local oscillation signal.

The intermediate frequency processing means includes a first dielectric filter supplied with an output of the first frequency converting means; first intermediate frequency amplifying means supplied with an output of the first dielectric filter; and a second dielectric filter supplied with an output of the first intermediate frequency amplifying means; and the input and output terminals of the intermediate frequency processing means are disposed on a diagonal line while the first and second dielectric filters are disposed on a printed circuit board with the first intermediate frequency amplifying means disposed therebetween.

With the above construction, since the intermediate frequency processing means includes the first dielectric filter supplied with an output of the first frequency converting means, the first intermediate frequency amplifying means supplied with an output of the first dielectric filter, and the second dielectric filter supplied with an output of the first intermediate frequency amplifying means and the input and output terminals of the intermediate frequency processing means are disposed on a diagonal line while the first and second dielectric filters are disposed on the printed circuit board with the first intermediate frequency amplifying means disposed therebetween, then sufficient isolation can be attained between the input and output.

Further, a double super tuner according to this invention comprises first frequency converting means for frequency-converting an input high-frequency signal into a first intermediate frequency signal based on a first local oscillation signal; and second frequency converting means for converting the first intermediate frequency signal output from the first frequency converting means into a second intermediate frequency signal based on a second local oscillation signal. In this case, an insertion component and on-surface mounting component are mounted on one surface of the printed circuit board and an earth pattern is formed on most part of the other surface of the printed circuit board.

With the above construction, since the insertion component and on-surface mounting component are mounted on one surface of the printed circuit board and the earth pattern is formed on most part of the other surface of the printed circuit board, necessary circuit isolation can be attained even when the size of the tuner is reduced, spurious disturbance caused by outputting the frequency of a difference between high-order harmonics of two local oscillation signals inherent to the double super tuner into the first intermediate frequency band can be relatively easily suppressed, and it becomes effective for suppression of leakage and reduction of influence of the cover.

Further, in a dielectric filter soldering method of this invention for coating cream solder on a component earth land formed on the printed circuit board by use of a solder mask and soldering a dielectric filter, solder resist are set in preset positions on the component earth land.

With the above method, since the solder resists are set in preset positions on the component earth land, the thickness of the solder can be made larger than the prior art case by using the solder mask of the same size, that is, by use of the same amount of solder. Further, since the solder on the solder resist is scattered in all directions and a space is formed between the solder resist and the dielectric filter, stress due to temperature variation and impact can be alleviated. Further, since a gap can be made between the printed circuit board and the dielectric filter by using the solder resist, force acting on the solder can be reduced and cut-off of the solder can be prevented even when the expansion coefficients of the printed circuit board and the dielectric filter are different.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A and 3B are block diagrams for respectively illustrating a first embodiment of a double super tuner according to this invention and a modification thereof;

FIGS. 4A and 4B are block diagrams for respectively illustrating a second embodiment of a double super tuner according to this invention and a modification thereof;

FIGS. 5A and 5B are diagrams for respectively illustrating the frequency characteristic of a single dielectric filter and the frequency characteristic of a dielectric filter in the second embodiment;

FIG. 6 is a block diagram for illustrating a third embodiment of a double super tuner according to this invention;

FIG. 9 is a block diagram for illustrating a sixth embodiment of a double super tuner according to this invention;

FIG. 10 is a block diagram for illustrating a seventh embodiment of a double super tuner according to this invention;

FIGS. 11A to 11C are a side cross sectional view and perspective views for illustrating an eighth embodiment of a double super tuner according to this invention;

FIG. 12 is a plan view for illustrating a ninth embodiment of a double super tuner according to this invention;

DETAILED DESCRIPTION OF THE PREFERRED EMBODIMENTS

Figure 1:
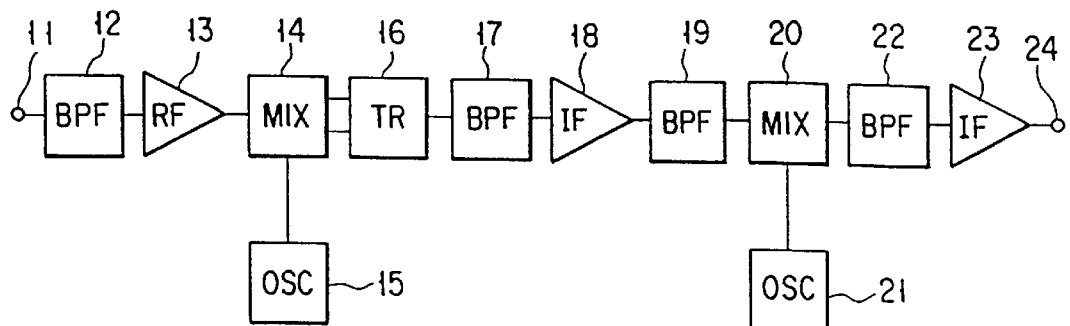
FIG. 1 is a block diagram for illustrating the operation and construction of a conventional double super tuner.
Figure 2A:
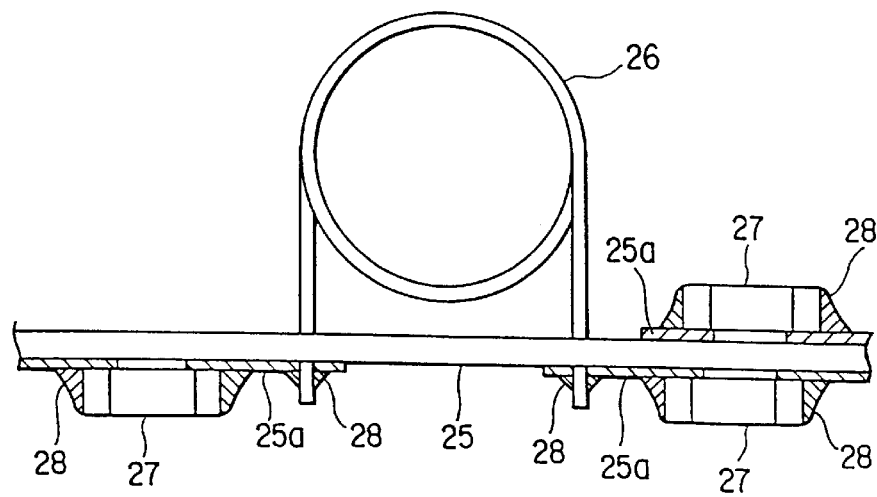
FIGS. 2A and 2B are respectively a side cross sectional view for illustrating the mounting state of circuit components on a printed circuit board when constructing the above tuner and a perspective view showing the structure for shielding the circuit blocks formed on the printed circuit board.
Figure 2B:
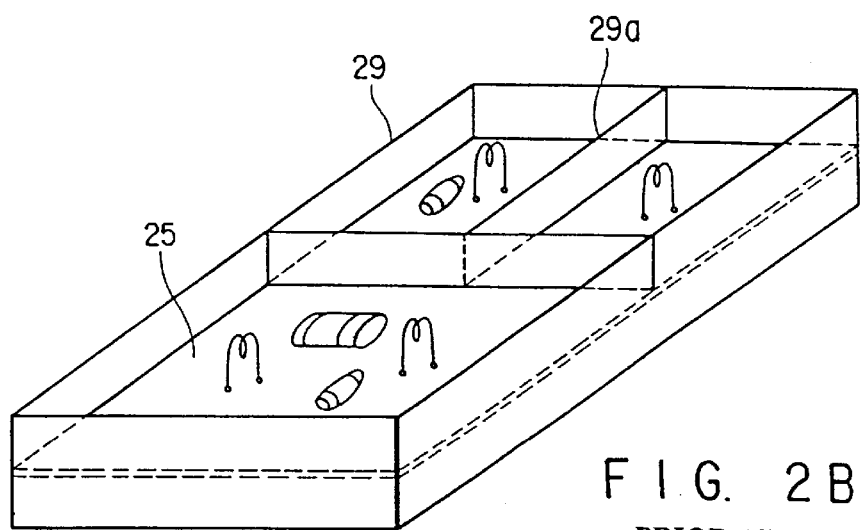

There will now be described embodiments of this invention with reference to the accompanying drawings. FIG. 3A shows a first embodiment of this invention and portions which are the same as those of FIG. 1 are denoted by the same reference numerals. In the first embodiment, BPFs 17, 19 for first intermediate frequency are constructed by dielectric filters.

That is, in the conventional case, the BPFs 17, 19 for first intermediate frequency are constructed by L (coil)/C (capacitor) tuned filters or helical filters. However, when the L/C tuned filter or helical filter is used, the value of Q of the circuit cannot be made large and it is difficult to obtain a sufficiently large amount of attenuation in a frequency region near the central frequency. Further, after it is mounted on the tuner, the adjustment therefor is necessary.

On the other hand, if the BPFs 17, 19 for first intermediate frequency are constructed by dielectric filters, the attenuation amount required for the band-pass filter for the first intermediate frequency band can be stably attained even when it becomes necessary to set a high first intermediate frequency for wideband reception. Further, the stable operation can be attained even with temperature variation and deterioration with time.

Further, if the first intermediate frequency is set in a frequency band of 600 MHz, it is possible to insert one BPF 30 for first intermediate frequency band constructed by a dielectric filter between a balanced-unbalanced converting transformer 16 and a second frequency converting circuit 20 as shown in FIG. 3B. It becomes possible to make it unnecessary to adjust the band-pass filter for first intermediate frequency band.

FIG. 4A shows a second embodiment of this invention and portions which are the same as those of FIG. 3A are denoted by the same reference numerals. In the second embodiment, a feed-through capacitor 31 is inserted between the balanced-unbalanced converting transformer 16 and the BPF 17 for first intermediate frequency constructed by a dielectric filter and a feed-through capacitor 32 is inserted between the BPF 17 for first intermediate frequency and a first intermediate frequency amplifier circuit 18.

That is, a general dielectric filter has a frequency characteristic as shown in FIG. 5A and a sufficient amount of attenuation in the high-frequency band cannot be attained by use of the single dielectric filter, and particularly, almost no attenuation can be attained in high-order resonance points in odd numbers. Therefore, there occurs a problem that the frequency of a difference between high-order harmonics generated from the first and second local oscillation circuits 15 and 21 is lowered into the second frequency band to easily generate spurious disturbances.

However, by connecting the feed-through capacitors 31, 32 to the input terminal and output terminal of the BPF 17 for first intermediate frequency, the frequency characteristic as shown in FIG. 5B can be obtained and a sufficiently large amount of attenuation can be attained in the high-frequency band.

Further, in a case where the BPF 30 for first intermediate frequency band constructed by a dielectric filter is connected between the balanced-unbalanced converting transformer 16 and the second frequency converting circuit 20 as shown in FIG. 3B, the same effect can be attained by connecting the feed-through capacitors 31, 32 to the input terminal and output terminal of the BPF 30 as shown in FIG. 4B.

FIG. 6 shows a third embodiment of this invention and portions which are the same as those of FIG. 3A are denoted by the same reference numerals. In the third embodiment, a notch filter 33 including a coupling capacitor C1, tuning inductor L1 and tuning capacitor C2 is inserted between a BPF 30 for first intermediate frequency constructed by a dielectric filter and a second frequency converting circuit 20. The resonance point of the notch filter 33 is determined by a parallel circuit of the tuning inductor L1 and tuning capacitor C2.

That is, if only the BPF 30 for first intermediate frequency constructed by the dielectric filter is inserted between the balanced-unbalanced converting transformer 16 and the second frequency converting circuit 20 as shown in FIG. 3B, it becomes difficult to attain a sufficiently large amount of attenuation in the image rejection band of the second frequency converting circuit 20. Particularly, when only one dielectric filter is used, it becomes more difficult.

However, if the notch filter 33 is connected to the output terminal of the BPF 30 for first intermediate frequency as described above, it becomes easy to attain a sufficiently large amount of attenuation in the image rejection band of the second frequency converting circuit 20. The notch filter 33 can also be used for leakage prevention of the first local oscillation circuit 15. Further, the same effect can be attained if the notch filter 33 is connected to the input terminal of the BPF 30 for first intermediate frequency. The coupling capacitor C1 may be replaced by a coupling inductor.

Figure 7:
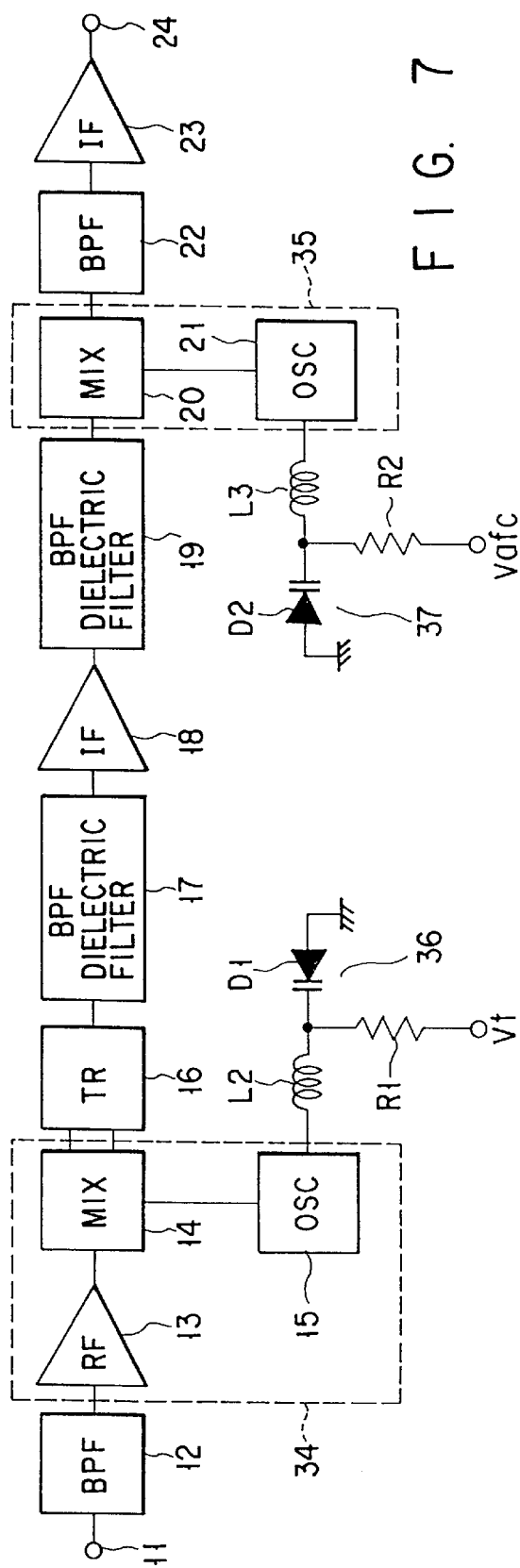
FIG. 7 is a block diagram for illustrating a fourth embodiment of a double super tuner according to this invention.

FIG. 7 shows a fourth embodiment of this invention and portions which are the same as those of FIG. 3A are denoted by the same reference numerals. In the fourth embodiment, an RF amplifier circuit 13, first frequency converting circuit 14 and first local oscillation circuit 15 are formed in an integrated circuit form and used as a first frequency converting section 34, and a second frequency converting circuit 20 and second local oscillation circuit 21 are formed in an integrated circuit form and used as a second frequency converting section 35. A tuning circuit 36 including a coil L2, resistor R1 and variable capacitance diode D1 is attached to the first local oscillation circuit 15 from the exterior, and a tuning circuit 37 including a coil L3, resistor R2 and variable capacitance diode D2 is attached to the second local oscillation circuit 21 from the exterior.

That is, in the conventional case, a diode double balance mixer constructed by a discrete component is used as the first frequency converting section 34, and a diode mixer or FET (Field Effect Transistor) constructed by a discrete component is used as the second frequency converting section 35. For this reason, there occurs a problem that spurious disturbance caused by outputting the frequency of a difference between high-order harmonics generated from the first and second local oscillation circuits 15, 21 into the first intermediate frequency band tends to occur.

However, in this embodiment, since the active type mixers formed in the integrated circuit form are used as the first and second frequency converting sections 34, 35, it becomes possible to reduce the leakage between the first and second local oscillation circuits 15 and 21. Therefore, spurious disturbance caused by outputting the frequency of a difference between high-order harmonics generated from the first and second local oscillation circuits 15, 21 into the first intermediate frequency band can be relatively easily suppressed. At the same time, a reduction in the size and improvement of the performance can be attained.

Figure 8:
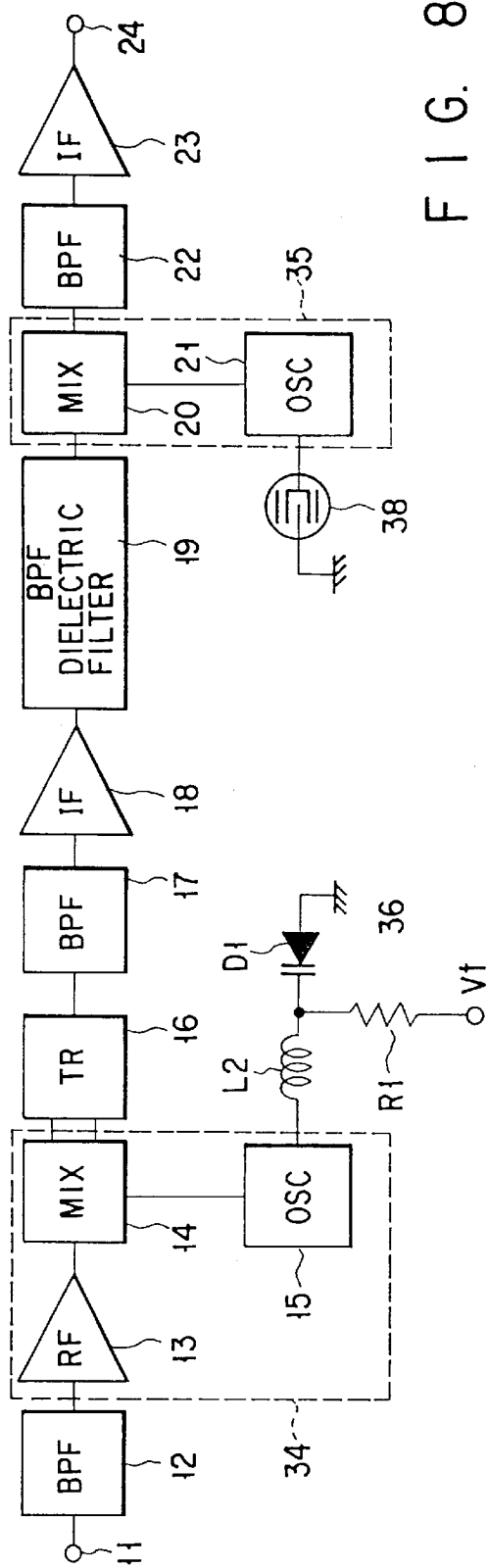
FIG. 8 is a block diagram for illustrating a fifth embodiment of a double super tuner according to this invention.

FIG. 8 shows a fifth embodiment of this invention. In the fifth embodiment, a surface acoustic wave (SAW) resonator 38 is used as a resonance circuit used in the second local oscillation circuit 21.

That is, in the conventional case, since an L/C resonance circuit is used as the resonance circuit of the second local oscillation circuit 21, it is difficult to attain the sufficiently high frequency-stability with respect to the temperature variation and humidity variation. However, if the SAW resonator 38 is used as the resonance circuit used in the second local oscillation circuit 21, it becomes possible to attain the sufficiently high frequency-stability with respect to the temperature variation and humidity variation.

FIG. 9 shows a sixth embodiment of this invention. In the sixth embodiment, a dielectric resonator 39 is used as a resonance circuit used in the second local oscillation circuit 21. That is, in the conventional case, since an L/C resonance circuit is used as the resonance circuit of the second local oscillation circuit 21, it is difficult to attain the sufficiently high frequency-stability with respect to the temperature variation and humidity variation. However, if the dielectric resonator 39 is used as the resonance circuit used in the second local oscillation circuit 21, it becomes possible to attain the sufficiently high frequency-stability with respect to the temperature variation and humidity variation.

FIG. 10 shows a seventh embodiment of this invention. In the seventh embodiment, a trimmer capacitor 40 is connected as a variable impedance element to a transmission line 14*a* for transmitting one of balanced outputs of the first frequency converting circuit 14 between the first frequency converting circuit 14 and the balanced-unbalanced converting transformer 16. That is, as described before, if the first frequency converting circuit 14 and the balanced-unbalanced converting transformer 16 are simply directly connected in a balanced form, the circuit balance and physical balance between the first frequency converting circuit 14 and the balanced-unbalanced converting transformer 16 become insufficient.

Since the balance adjustment can be effected by connecting the trimmer capacitor 40 to the transmission line 14*a* for transmitting one of balanced outputs of the first frequency converting circuit 14, the unbalanced components of the first frequency converting section 34 formed in the integrated circuit form, balanced-unbalanced converting transformer 16 and the peripheral circuits can be corrected, thereby making it possible to improve the distortion characteristic and leakage characteristic.

FIGS. 11A to 11C show an eighth embodiment of this invention. As shown in FIG. 11A, a dielectric filter 41 constructing the BPFs 17, 19, 30 for first intermediate frequency and the like is constructed in a non-insertion form, an electrode 41*a* thereof is connected to a circuit pattern 42*a* formed on the front surface of a printed circuit board 42 via solder 43, and an electrode 18*a* of a first intermediate frequency amplifying circuit 18 is connected to a circuit pattern 42*b* formed on the rear surface of the printed circuit board 42 via solder 43. FIGS. 11B and 11C show the states of the printed circuit board 42 when viewed from the front side and rear side thereof, respectively.

In the conventional case, since an insertion type BPF is used, it becomes difficult to attain isolation between the first intermediate frequency amplifying circuit 18 and the BPF if the first intermediate frequency amplifying circuit 18 is disposed on the other surface with respect to the BPF. However, if the non-insertion type dielectric filter 41 is mounted on the front surface of the printed circuit board 42 and the first intermediate frequency amplifying circuit 18 is mounted on the rear surface of the printed circuit board 42, the size can be reduced without sacrificing isolation between the dielectric filter 41 and the first intermediate frequency amplifying circuit 18.

FIG. 12 shows a ninth embodiment of this invention. In the ninth embodiment, two dielectric filters 44, 45 constituting the BPFs 17, 19 for first intermediate frequency are disposed with a preset distance therebetween on the front surface of a printed circuit board 42. The dielectric filters 44, 45 each have three connection electrodes on each longitudinal side surface, that is, six connection electrodes 44*a* to 44*f*, 45*a* to 45*f* in total.

In the dielectric filters 44, 45, the connection electrodes 44*a*, 45*a* respectively disposed on the upper left portions thereof are used as input terminals and the connection electrodes 44*f*, 45*f* respectively disposed on the lower right portions thereof are used as output terminals. That is, in the dielectric filters 44, 45, the connection electrodes 44*a*, 45*a* used as the input terminals and the connection electrodes 44*f*, 45*f* used as the output terminals are arranged on respective diagonal lines.

Further, a first intermediate frequency amplifying circuit 18 is disposed in substantially the central position between the dielectric filters 44 and 45 on the rear surface of the printed circuit board 42. A connection electrode 44*f* acting as the output terminal of the dielectric filter 44 is connected to the input electrode 18*b* of the first intermediate frequency amplifying circuit 18 via a circuit pattern 42*c* formed on the rear surface of the printed circuit board 42, and the output electrode 18*c* of the first intermediate frequency amplifying circuit 18 is connected to a connection electrode 45*a* acting as the input terminal of the dielectric filter 45 via a circuit pattern 42*d* formed on the rear surface of the printed circuit board 42.

In this case, if a combination circuit of the dielectric filters 44, 45 and the first intermediate frequency amplifying circuit 18 is regarded as one intermediate frequency processing circuit for effecting the process of supplying a first intermediate frequency signal output from the balanced-unbalanced converting transformer 16 to the second frequency converting circuit 20, a connection electrode 44a acting as the input terminal of the intermediate frequency processing circuit and a connection electrode 45f acting as the output terminal thereof are disposed on a diagonal line of the intermediate frequency processing circuit.

That is, the input and output terminals of each of the dielectric filters 44, 45 are disposed on the diagonal line thereof, and at the same time, the input and output terminals of the intermediate frequency processing circuit constructed by a combination of the dielectric filters 44, 45 and the first intermediate frequency amplifying circuit 18 are also disposed on the diagonal line thereof. With this arrangement, sufficient isolation can be attained between the input and output terminals of the dielectric filters 44, 45.

Figure 13A:
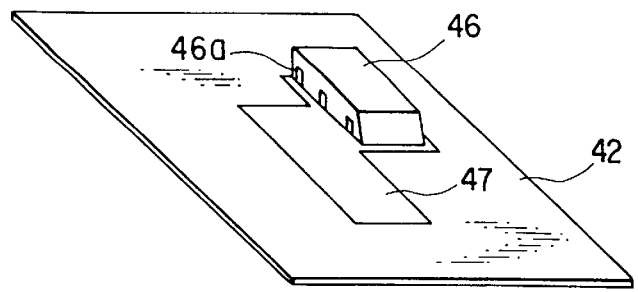
FIGS. 13A and 13B are a perspective view and plan view for illustrating a tenth embodiment of a double super tuner according to this invention.
Figure 13B:
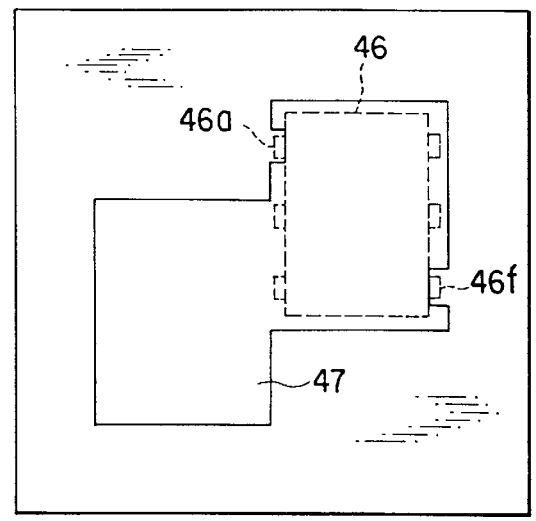

FIGS. 13A and 13B show a tenth embodiment of this invention. As shown in FIG. 13A, an earth pattern 47 having a larger area than the contact area of a dielectric filter 46 with the printed circuit board 42 is formed on the front surface of the printed circuit board 42 in a portion in which the dielectric filter 46 constituting BPFs 17, 19, 30 for first intermediate frequency is disposed.

The earth pattern 47 is formed to extend towards the side on which a connection electrode 46a acting as the input terminal of the dielectric filter 46 is formed so that it may have an area larger than the contact area of the dielectric filter 46 with the printed circuit board 42. As shown in FIG. 13B, the earth pattern 47 is cut away in portions corresponding to connection electrodes 46a, 46f acting as the input and output terminals of the dielectric filter 46. Thus, the earth pattern 47 can be made large and sufficient isolation can be attained between the input and output terminals of the dielectric filter 46.

Figure 14:
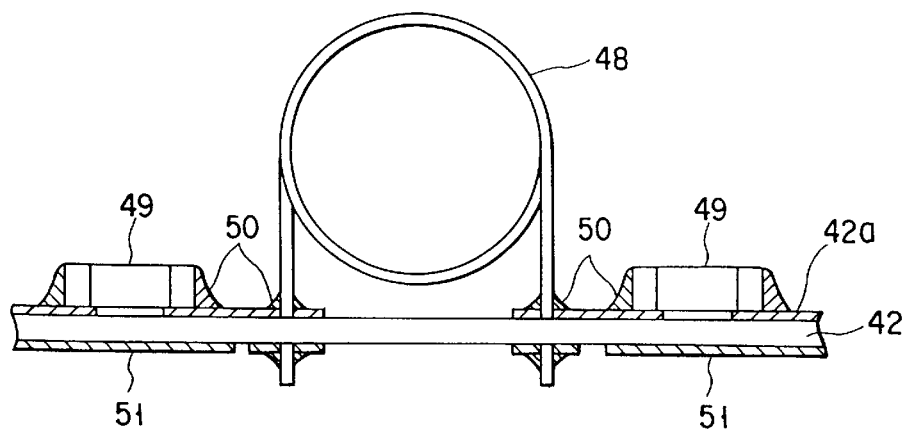
FIG. 14 is a side cross sectional view for illustrating an eleventh embodiment of a double super tuner according to this invention.

FIG. 14 shows an eleventh embodiment of this invention. In the eleventh embodiment, for example, an insertion component 48 such as an air-core coil and various types of on-surface mounting components 49 are connected to a circuit pattern 42a formed on the front surface of a printed circuit board 42 via solder 50. An earth pattern 51 is formed on most part of the rear surface of the printed circuit board 42 except part of signal lines and power supply lines and the lead portion of the insertion component 48.

With the above arrangement, necessary circuit isolation can be attained even when the tuner is made small. Further, spurious disturbance caused by outputting the frequency of a difference between high-order harmonics which are generated from the first and second local oscillation circuits 15, 21 and inherent to the double super tuner into the first intermediate frequency band can be relatively easily suppressed, it becomes significantly effective for suppression of leakage and reduction of influence of the cover, and the thickness of the tuner can be made sufficiently small.

Figure 15A:
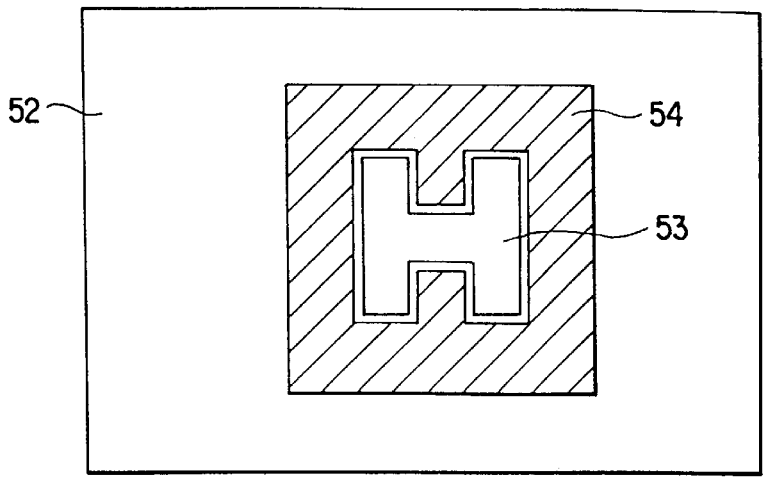
FIGS. 15A and 15B are a plan view and side cross sectional view for illustrating a method of soldering a dielectric filter on a printed circuit board.
Figure 15B:
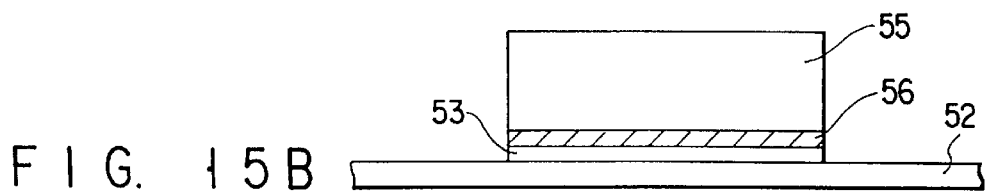

Next, the process of soldering the dielectric filter to the printed circuit board by reflow is explained. In the above dielectric filter, the method for stable connection in a small area is used, the entire portion except the connection terminals is made as an earth pattern. Therefore, in the prior art, a component earth land 53 with which a dielectric filter (not shown) is made in contact is formed on a printed circuit board 52 as shown in FIG. 15A, and a dielectric filter is disposed on the component earth land 53 with a solder mask 54 disposed therebetween and solder is poured therein. As a result, the dielectric filter 55 is connected to the component earth land 53 on the printed circuit board 52 via solder 56.

In this case, if the area of the component earth land 53 is S1, the area of a portion of the solder mask 54 which is cut away in the form of the component earth land 53 is S1×K (K is generally 1.1), and the thickness of the solder mask 54 is T1, then the thickness T2 of the solder 56 is expressed by the following equation.

$$T2 = S1 \times K \times T1/S1 = T1 \times 1.1.$$

In order to increase the thickness of the solder 56, the area S1×K of the cut-away portion of the solder mask 54 may be made large, that is, K may be set larger than 1.1, but if the thickness of the solder 56 is made excessively large, part of the solder 56 may be leaked from the component earth land 53 to form a solder ball. If K is set smaller than 1.1, the thickness of the solder 56 is made small and the solder may be cut off in the TST test by a difference between the expansion coefficients of the printed circuit board 52 and the dielectric filter 55. The above problems become the main cause of deterioration in the high-frequency characteristic and manufacturing of defective devices.

Figure 16A:
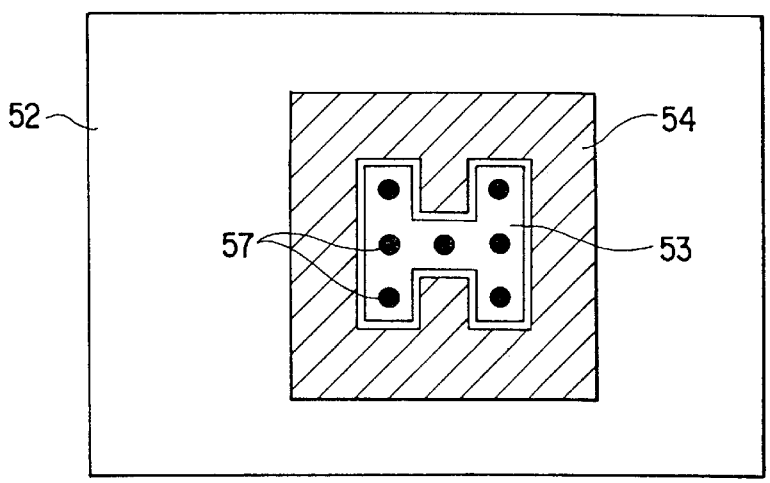
FIGS. 16A and 16B are a plan view and side cross sectional view for illustrating a twelfth embodiment of a double super tuner according to this invention.
Figure 16B:
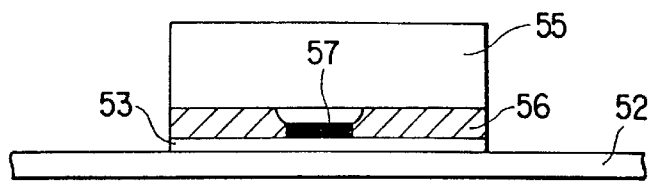

FIG. 16A and 16B show a twelfth embodiment of this invention. In the twelfth embodiment, solder resists 57 are formed in preset positions on a component earth land 53. Further, a dielectric filter 55 is disposed on the solder resists 57 with a solder mask 54 disposed therebetween and solder 56 is poured therein.

With the above structure, if the area of the component earth land 53 is S1×0.7, the area of a portion of the solder mask 54 which is cut away is S1×1.1, and the thickness of the solder mask 54 is T1, then the thickness T2' of the solder 56 is expressed by the following equation.

$$T2' = S1 \times 1.1 \times T1/S1 \times 0.7 = T1 \times 1.57.$$

Therefore, the following equation can be obtained.

$$T2' = 1.43 \times T2$$

Thus, the thickness of the solder 56 can be made larger than in the conventional case by using the solder mask 54 of the same size, that is, by use of the same amount of solder 56.

Further, since the solder 56 on the solder resist 57 is scattered in all directions, a space is formed between the solder resist 57 and the dielectric filter 55. Therefore, stress due to temperature variation and impact can be alleviated. Further, since a gap can be made between the printed circuit board 52 and the dielectric filter 55 by using the solder resist 57, force acting on the solder 56 can be reduced and cut-off of the solder can be prevented even when the expansion coefficients of the printed circuit board 52 and the dielectric filter 55 are different.

This invention is not limited to the above embodiments and can be variously modified without departing from the technical scope thereof.

What is claimed is:

1. A double super tuner including a tuner circuit, the tuner circuit comprising:

first frequency converting means for combining an input high-frequency signal with a first local oscillation signal, thereby producing a first intermediate-frequency signal;

second frequency converting means for combining the first intermediate-frequency signal with a second local oscillation signal, thereby producing a second intermediate-frequency signal;

a printed circuit board having a first surface and a second surface, the first surface being structured for mounting the first and second frequency converting means;

at least one on-surface mounting component and at least one insertion component, the on-surface mounting component being mounted on a circuit pattern of the first surface and the insertion component being inserted into the printed circuit board through the circuit pattern; and an earth pattern being formed on a majority of an area of the second surface.

2. A double super tuner including a tuner circuit, the tuner circuit comprising:

first frequency converting means for combining an input high-frequency signal with a first local oscillation signal, thereby producing a first intermediate-frequency signal;

second frequency converting means for combining the first intermediate-frequency signal with a second local oscillation signal, thereby producing a second intermediate-frequency signal;

a printed circuit board having a first surface and a second surface, the first surface being structured for mounting the first and second frequency converting means;

at least one an on-surface mounting component and at least one insertion component, the on-surface mounting component being mounted on a circuit pattern of the first surface and the insertion component being inserted into the printed circuit board through the circuit pattern, and an earth pattern being formed on a majority of an area of the second surface, the insertion component being attachable to the second surface on which the earth pattern is formed.

* * * * *